(12) United States Patent
Saitoh et al.

(10) Patent No.: US 10,754,387 B2
(45) Date of Patent: Aug. 25, 2020

(54) FLEXIBLE DISPLAY DEVICE

(71) Applicant: Sharp Kabushiki Kaisha, Sakai, Osaka (JP)

(72) Inventors: Takao Saitoh, Sakai (JP); Yohsuke Kanzaki, Sakai (JP); Masaki Yamanaka, Sakai (JP); Yi Sun, Sakai (JP); Seiji Kaneko, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/473,261

(22) PCT Filed: Sep. 29, 2017

(86) PCT No.: PCT/JP2017/035611
§ 371 (c)(1),
(2) Date: Jun. 25, 2019

(87) PCT Pub. No.: WO2019/064534
PCT Pub. Date: Apr. 4, 2019

(65) Prior Publication Data
US 2020/0150725 A1 May 14, 2020

(51) Int. Cl.
| H05K 1/02 | (2006.01) |
| H05K 1/18 | (2006.01) |
| H05K 3/46 | (2006.01) |
| H05K 5/00 | (2006.01) |
| H01L 27/12 | (2006.01) |
| H01L 27/32 | (2006.01) |
| H01L 51/00 | (2006.01) |
| H01L 51/50 | (2006.01) |
| H01L 51/52 | (2006.01) |
| H01L 51/56 | (2006.01) |

(Continued)

(52) U.S. Cl.
CPC ............ *G06F 1/1652* (2013.01); *G09F 9/301* (2013.01); *H01L 27/3276* (2013.01); *H01L 51/0097* (2013.01)

(58) Field of Classification Search
CPC .. H05K 1/02; H05K 1/18; H05K 3/46; H05K 5/00; H01L 27/12; H01L 27/32; H01L 51/00; H01L 51/50; H01L 51/52; H01L 51/56
USPC ........................ 361/679.02; 428/121; 257/40
See application file for complete search history.

(56) References Cited

U.S. PATENT DOCUMENTS

| 2014/0138637 A1 | 5/2014 | Yang et al. |
| 2014/0353670 A1 | 12/2014 | Youn et al. |
| 2016/0174304 A1 | 6/2016 | Kim et al. |

(Continued)

FOREIGN PATENT DOCUMENTS

| CN | 103700322 A | 4/2014 |
| JP | 06-246857 A | 9/1994 |

(Continued)

OTHER PUBLICATIONS

Official Communication issued in International Patent Application No. PCT/JP2017/035611, dated Dec. 12, 2017.

*Primary Examiner* — Xiaoliang Chen
(74) *Attorney, Agent, or Firm* — Keating & Bennett, LLP

(57) ABSTRACT

Provided is a lead wiring line formed on a reinforcement film, and the lead wiring line includes a portion overlapping a bottom portion of a recessed portion in a plan view and a portion overlapping a head portion of a protruding portion in a plan view.

20 Claims, 14 Drawing Sheets

(51) Int. Cl.
*G06F 1/16* (2006.01)
*G09F 9/30* (2006.01)

(56) References Cited

U.S. PATENT DOCUMENTS

| | | | |
|---|---|---|---|
| 2016/0204185 A1 | 7/2016 | Iijima et al. | |
| 2017/0020007 A1* | 1/2017 | Park | G06F 1/1615 |
| 2017/0062485 A1* | 3/2017 | Kwon | H01L 27/1222 |
| 2017/0077447 A1* | 3/2017 | Kang | H01L 27/3246 |
| 2017/0092708 A1* | 3/2017 | Jeon | H01L 27/127 |
| 2017/0170206 A1 | 6/2017 | Lee et al. | |
| 2018/0053816 A1* | 2/2018 | Choi | H01L 27/3276 |
| 2018/0095571 A1* | 4/2018 | Park | G06F 3/0412 |
| 2019/0019993 A1* | 1/2019 | Narutaki | H01L 27/1225 |
| 2019/0088895 A1* | 3/2019 | Ishida | H01L 51/5253 |
| 2019/0363287 A1* | 11/2019 | Kishimoto | H01L 51/0097 |
| 2019/0372032 A1* | 12/2019 | Kaneko | G09F 9/30 |

FOREIGN PATENT DOCUMENTS

| | | |
|---|---|---|
| JP | 2014-232300 A | 12/2014 |
| JP | 2016-503515 A | 2/2016 |
| JP | 2016-136515 A | 7/2016 |
| JP | 2017-111435 A | 6/2017 |
| WO | 2014/126403 A1 | 8/2014 |

\* cited by examiner

FLEXIBLE DISPLAY DEVICE

TECHNICAL FIELD

The disclosure relates to a flexible display device and a method of manufacturing a flexible display device.

BACKGROUND ART

PTL 1 discloses a flexible display device capable of being bent 180 degrees at a bending region provided with lead wiring lines.

CITATION LIST

Patent Literature

PTL 1: JP 2014-232300 A (published on Dec. 11, 2014)

SUMMARY

Technical Problem

The lead wiring lines in the bending region of the configuration disclosed in Patent Literature 1 are formed on a planar-shape foundation film. Hence, the configuration of Patent Literature has a problem of easily causing breakage of lead wiring lines in the bending region due to stress acting on the lead wiring lines when the flexible display device is bent at the bending region.

The disclosure has been made in view of the problem described above, and provides a flexible display device capable of suppressing the breakage of lead wiring lines provided in the bending region and a method of manufacturing such a flexible display device.

Solution to Problem

To solve the above-described problem, the disclosure provides a flexible display device including: a display region; a frame region surrounding the display region; a terminal portion provided in an end portion of the frame region; a bending region provided between the display region and the terminal portion; and a lead wiring line configured to electrically connect a first wiring line located on one side of the bending region and a second wiring line located on a different side of the bending region. The bending region is a slit-shaped region formed by removing at least a part of an inorganic film including one or more layers. The bending region is filled with a first resin layer including a plurality of recessed portions and a plurality of protruding portions, each of the recessed portions including a bottom portion having a smallest film thickness, and each of the protruding portions including a head portion having a largest film thickness. The lead wiring line is formed on the first resin layer, and includes portions overlapping, in a plan view, the bottom portions and the head portions arranged in a first direction in which the lead wiring line extends.

The flexible display device provided according to the configuration described above is capable of suppressing the breakage of the lead wiring lines provided in the bending region.

To solve the above-described problem, the disclosure provides a method of manufacturing a flexible display device including: a display region; a frame region surrounding the display region; a terminal portion provided in an end portion of the frame region; a bending region provided between the display region and the terminal portion; and a lead wiring line configured to electrically connect a first wiring line located on one side of the bending region and a second wiring line located on a different side of the bending region. The method includes: a bending region forming step for forming the bending region having a slit-shape by removing at least a part of an inorganic film including one or more layers; a first resin layer forming step for forming a first resin layer with which the bending region is filled by forming a plurality of recessed portions each of which includes a bottom portion having a smallest film thickness and a plurality of protruding portions each of which includes a head portion having a largest film thickness; and a lead wiring line forming step for forming the lead wiring line on the first resin layer by forming the lead wiring line configured to overlap, in a plan view, both the bottom portions and the head portions arranged in a first direction in which the lead wiring line extends.

The method described above is capable manufacturing a flexible display device that suppresses the breakage of lead wiring lines provided in the bending region.

Advantageous Effects of Disclosure

An aspect of the disclosure is capable of providing a flexible display device that is capable of suppressing the breakage of the lead wiring lines provided in the bending region and that is capable of suppressing film peeling, In addition, the aspect of the disclosure is capable of providing a method of manufacturing such a flexible display device.

DESCRIPTION OF EMBODIMENTS

Figure 1:
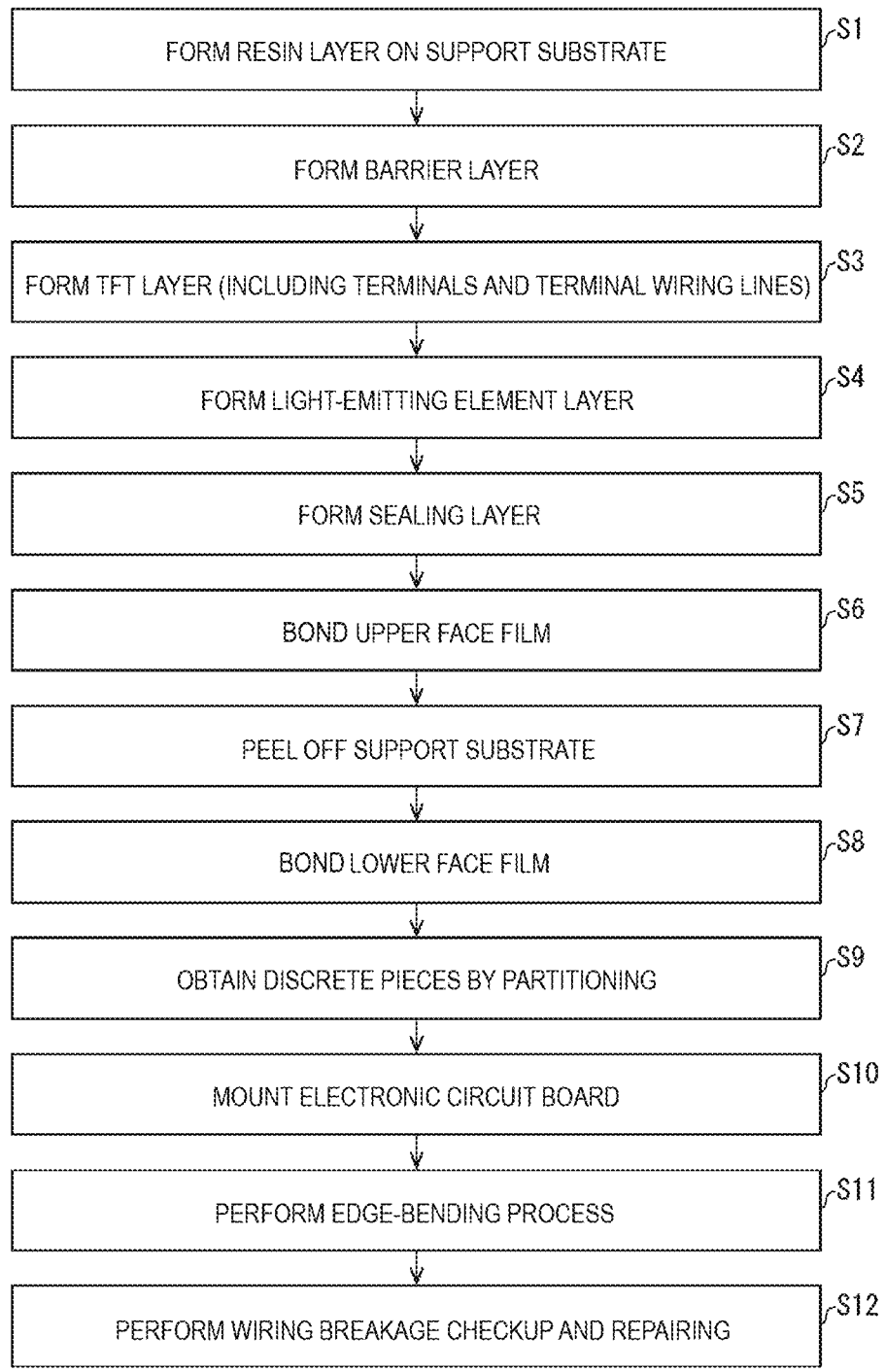
FIG. 1 is a flowchart illustrating an exemplar method of manufacturing a flexible EL display device according to a first embodiment.

Embodiments of the disclosure are described below with reference to FIGS. 1 to 14B. Hereinafter, for convenience of descriptions, a configuration having the same functions as those of a configuration described in a specific embodiment are denoted by the same reference numerals, and its descriptions may be omitted.

The following embodiments are based on cases in each of which the display element (optical element) is an organic electro luminescence (EL) element, but the disclosure is not limited such cases. Alternatively, for example, the display element may be a reflection-type liquid crystal display element or the like, whose luminance and transmittance are controlled by the voltage and which needs no backlight.

The display element (optical element) may be an optical element whose luminance and transmittance are controlled by the electric current. Some examples of the electric current-controlled optical element include an organic electro luminescence (EL) display provided with organic light emitting diodes (OLEDs), an EL display such as an inorganic EL display provided with inorganic light emitting diodes, or a quantum dot light emitting diode (QLED) display provided with QLEDs.

First Embodiment

A flexible EL display device 2 according to a first embodiment of the disclosure will be described below with reference to FIG. 1 to FIG. 9.

FIG. 1 is a flowchart illustrating an exemplar method of manufacturing a flexible EL display device 2.

Figure 2:
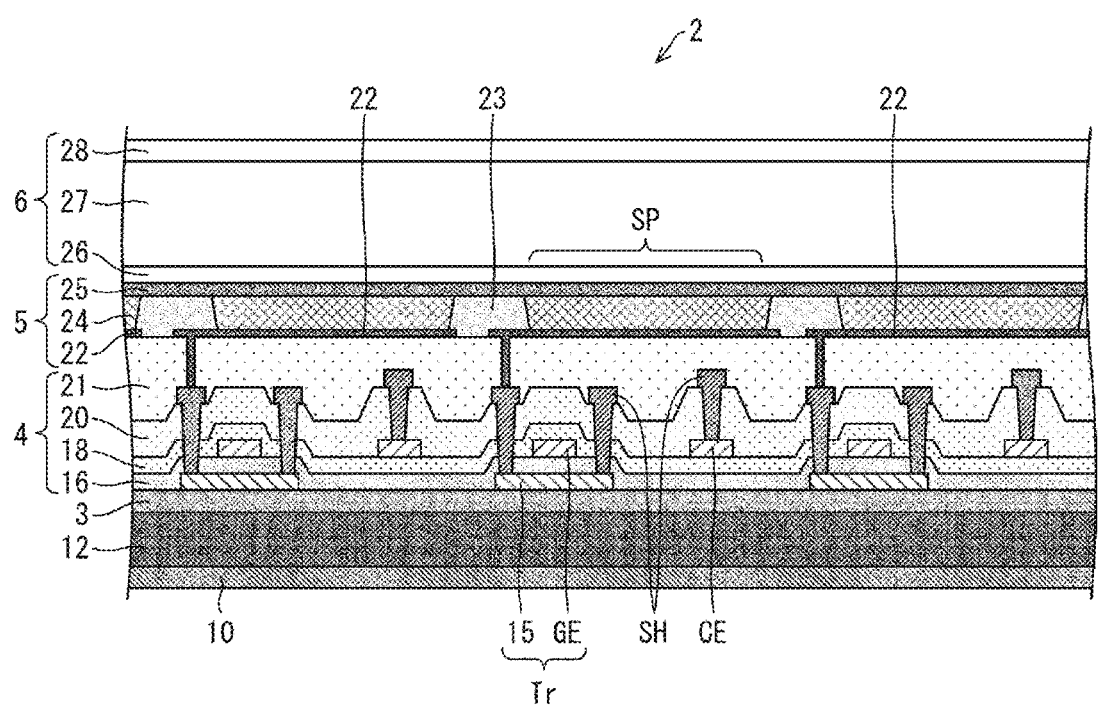
FIG. 2 is a cross-sectional view illustrating a configuration example of a display portion of the flexible EL display device of the first embodiment.

FIG. 2 is a cross-sectional view illustrating a configuration example of a display portion of the flexible EL display device 2.

Figure 3:
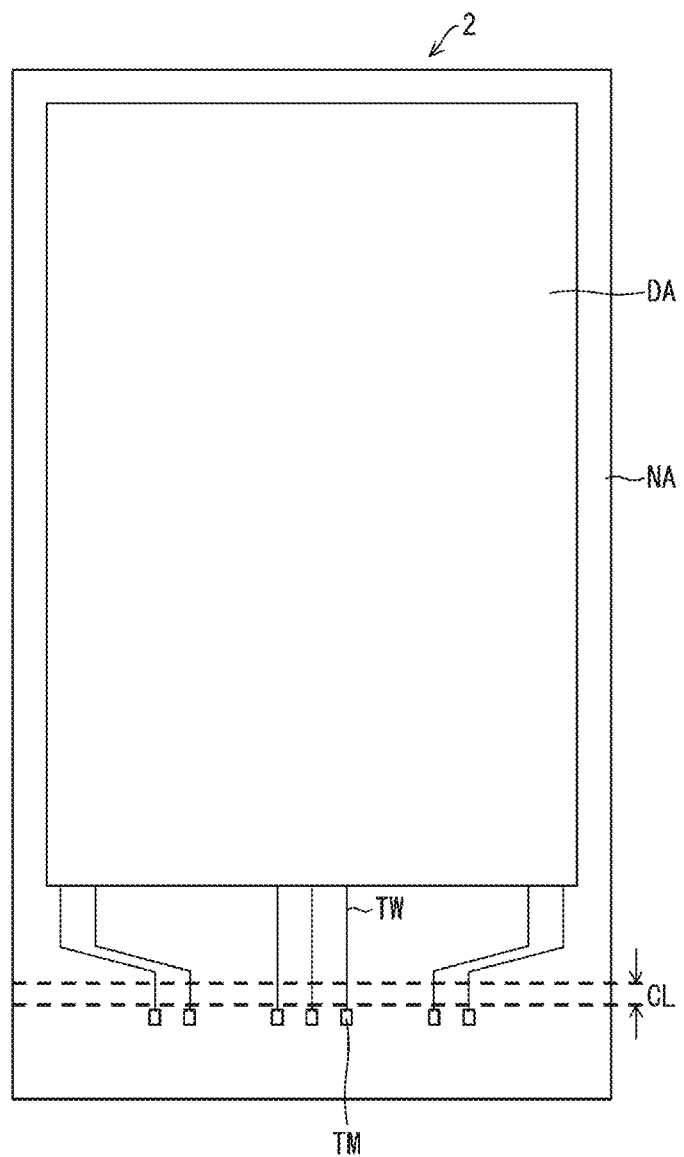
FIG. 3 is a plan view illustrating a configuration example of the flexible EL display device of the first embodiment.

FIG. 3 is a plan view illustrating a configuration example of the flexible EL display device 2.

In the following description, if a particular layer is "the same layer" as a target layer for comparison, the particular layer and the target layer for comparison are formed in the same process and made from the same materials. If a particular layer is a "lower layer" than a target layer for comparison, the particular layer is formed in a process performed before the process in which the target layer for comparison is formed. If a particular layer is an "upper layer" than a target layer for comparison, the particular layer is formed in a process performed after the process in which the target layer for comparison is formed.

Manufacturing the flexible EL display device 2 starts with the formation of a resin layer 12 on a light-transmissive support substrate (e.g., mother glass substrate) as illustrated in FIG. 1 to FIG. 3 (Step S1). Next, a barrier layer 3 is formed (Step S2). Then, a TFT layer 4 that includes both terminals (terminal portions) TM and terminal wiring lines TW is formed (Step S3). Then, an organic EL element layer 5, which is a light-emitting element layer, is formed as a display element (Step S4). Next, a sealing layer 6 is formed (Step S5). Then, an upper face film is bonded on the sealing layer 6 (Step S6). Note that the step of bonding the upper face film on the sealing layer 6 may be omitted when such omission is necessary. For example, the step may be omitted in a case where a touch panel is provided on an adhesive layer that is provided on the sealing layer 6. Then, the lower face of the resin layer 12 is irradiated with a laser light through the support substrate. The irradiation weakens the bonding force between the support substrate and the resin layer 12, and then the support substrate is peeled off from the resin layer 12 (Step S7). This step is referred to as a "Laser Lift OFF (LLO) step," as well. Then, a lower face film 10 is bonded to an adhesive layer provided on a surface of the resin layer 12, the surface being the one from which the support substrate has been peeled off (Step S8). Then, a layered body including the lower face film 10, the resin layer 12, the barrier layer 3, the TFT layer 4, the organic EL element layer 5, the sealing layer 6, and the upper face film is partitioned, and thus discrete pieces are obtained (Step S9). Then, an electronic circuit board (e.g., IC chip) is mounted on the terminals TM in the edge portion (Step S10). Then, edge-bending process (i.e., a process where a bending portion CL illustrated in FIG. 3 is bent at an angle of 180°) is performed, and thus the flexible EL display device 2 is completed (Step S11). Then, a wiring breakage check-up is performed. If a wiring breakage is found, the broken wiring lines are repaired (Step S12).

Examples of the material from which the resin layer 12 is made include a polyimide resin, an epoxy resin, a polyamide resin, and the like, but these are not the only possible examples.

Examples of the material from which the lower face film 10 is made are polyethylene terephthalate (PET) and the like, but these are not the only possible examples.

The barrier layer 3 is a layer that inhibits moisture or impurities from reaching the TFT layer 4 or the organic EL element layer 5 when the flexible EL display device 2 is being used, and can include a silicon oxide film, a silicon nitride film, a silicon oxynitride film, or a layered film thereof, formed by a CVD method.

The TFT layer 4 is formed as an upper layer of both the resin layer 12 and the barrier layer 3. The TFT layer 4 includes: a semiconductor film 15; an inorganic insulating film 16 (i.e., a gate insulating film) formed as a higher layer than the semiconductor film 15; a gate electrode GE formed as a higher layer than the inorganic insulating film 16; an inorganic insulating film 18 formed as a higher layer than the gate electrode GE; capacitance wiring lines CE formed as a higher layer than the inorganic insulating film 18; an inorganic insulating film 20 formed as a higher layer than the capacitance wiring lines CE; a source/drain wiring lines SH and terminals TM formed as a higher layer than the inorganic insulating film 20; a flattening film 21 (second resin layer) formed as a higher layer than the source/drain wiring lines SH and the terminals TM.

A thin film transistor Tr (TFT) is formed by including the semiconductor film 15, the inorganic insulating film 16 (gate insulating film), the gate electrode GE and the source/drain wiring lines SH.

The flexible EL display device 2 illustrated in FIG. 3 includes a display region DA and a frame region NA that is located on the outer side of the display region DA. In the frame region NA, the terminals TM and the terminal wiring lines TW (to be described in detail later) are formed. The terminals TM are used for connecting to an electronic circuit board such as an IC chip and an FPC. The terminal wiring lines TW are used for connecting the terminals TM and the wiring lines in the display region DA. The terminals TM are formed in an end portion of the frame region NA.

The semiconductor film 15 is formed of, for example, low temperature polysilicon (LTPS) or an oxide semiconductor. Note that a TFT is illustrated in FIG. 2. The illustrated TFT uses the semiconductor film 15 as a channel and has a top gate structure. The TFT, however, may have a bottom gate structure (e.g., in a case where the TFT channel is the oxide semiconductor).

The gate electrode GE, the capacitance electrodes CE, the source/drain wiring lines SH, the terminal wiring lines TW, and the terminals TM are formed, for example, of single-layer metal films or layered metal films. Such metal film or films include, at least one selected from aluminum (Al), tungsten (W), molybdenum (Mo), tantalum (Ta), chromium (Cr), titanium (Ti), and copper (Cu).

The inorganic insulating films 16, 18, and 20 may be formed of, for example, a silicon oxide (SiOx) film, a silicon nitride (SiNx) film, a silicon oxynitride film, or a layered film thereof, which are made by a CVD method.

The flattening film (interlayer insulating film) 21 is made, for example, from a coatable, photosensitive organic material such as a polyimide resin and an acrylic resin.

The organic EL element layer 5 includes: anodes 22 formed as a higher layer than the flattening film 21; a bank 23 covering the edges of each of the anodes 22; an electroluminescence (EL) layer 24 formed as a higher layer than the anodes 22; and a cathode 25 formed as a higher layer than the EL layer 24. Each subpixel includes the island-shaped anode 22, the EL layer 24, and the cathode 25. The bank 23 (anode edge cover) 23 may be made of a coatable photosensitive organic material such as a polyimide resin and an acrylic resin. The organic EL element layer 5 forms the display region DA, and is formed as a higher layer than the TFT layer 4.

For example, the EL layer 24 is formed by layering a hole injecting layer, a hole transport layer, a light emitting layer, an electron transport layer, and an electron injecting layer in this order, with the hole injecting layer being the bottom layer. The light-emitting layer is formed, by a vapor deposition method or an ink-jet method, into island shapes for individual subpixels. The other layers may be formed solid-like common layers. Alternatively, one or more of the hole injection layer, the hole transport layer, the electron transport layer, the electron injection layer may be omitted.

The anode 22 is formed by layering indium tin oxide (ITO) and an alloy containing Ag, for example, and has light reflectivity (to be described below in more detail). The cathode 25 can be constituted by a light-transmissive conductive material such as indium tin oxide (ITO) and indium zinc oxide (IZO).

In the organic EL element layer 5, positive holes and electrons are recombined inside the EL layer 24 by a drive current between the anode electrode 22 and the cathode electrode 25. The recombination generates excitons, and light is emitted when the excitons fall into a ground state. Since the cathode 25 is light-transmissive and the anode 22 is light-reflective, the light emitted from the EL layer 24 travels upwards and results in top emission.

The sealing layer 6 is light-transmissive, and includes: a first inorganic sealing film 26 that covers the cathode 25, an organic sealing film 27 that is formed above the first inorganic sealing film 26; and a second inorganic sealing film 28 that covers the organic sealing film 27. The sealing layer 6 covers the organic EL element layer 5 and inhibits foreign matter, such as water and oxygen, from infiltrating to the organic EL element layer 5.

Each of the first inorganic sealing film 26 and the second inorganic sealing film 28 can be constituted by a silicon oxide film, a silicon nitride film, or a silicon oxynitride film, or by a layered film of these, formed using CVD. The organic sealing film 27 is thicker than the first inorganic sealing film 26 and the second inorganic sealing film 28, is a light-transmissive organic film, and can be constituted by a coatable photosensitive organic material such as a polyimide resin, an acrylic resin, or the like.

As has been described thus far, the description of this embodiment is based on a case where the process of manufacturing the flexible EL display device 2 includes an LLO step, but such a manufacturing process is not the only possible process. Alternatively, for example, in a case where the support substrate to be used is a flexible substrate with a high enough heat resistance to withstand the temperatures in Step S1 to Step S5 described in FIG. 1, the replacement of the substrate with another structure is not necessary. Hence, in such a case, Step S7 and Step S8 described in FIG. 1 can be omitted.

Figure 4:
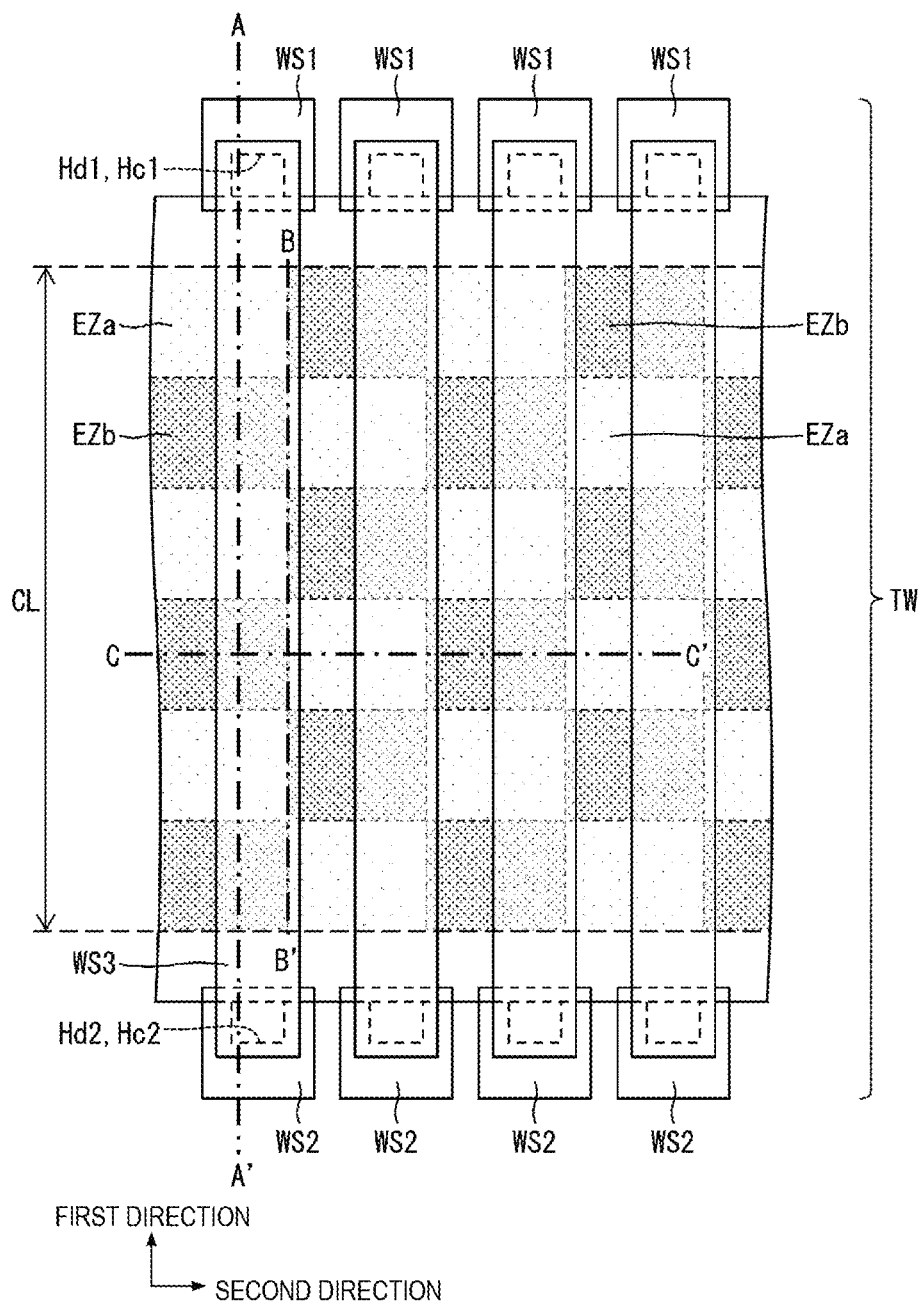
FIG. 4 is a plan view illustrating lead wiring lines provided in a bending region of the flexible EL display device of the first embodiment.

FIG. 4 is a plan view illustrating lead wiring lines WS3 provided in a bending region CL of the flexible EL display device 2.

Figure 5:
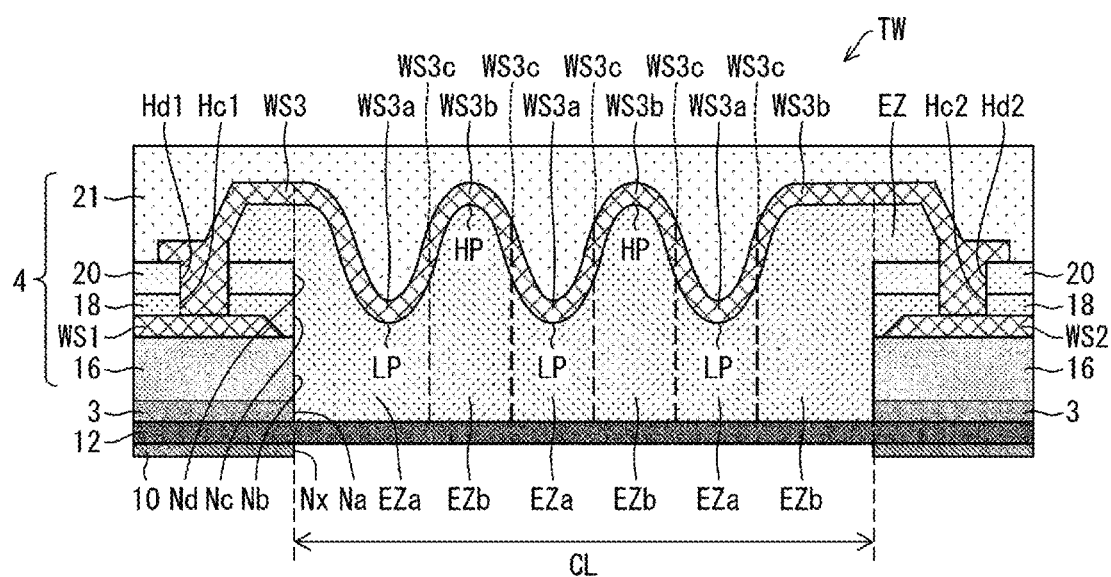
FIG. 5 is a cross-sectional view taken along the line A-A' in FIG. 4.
Figure 6:
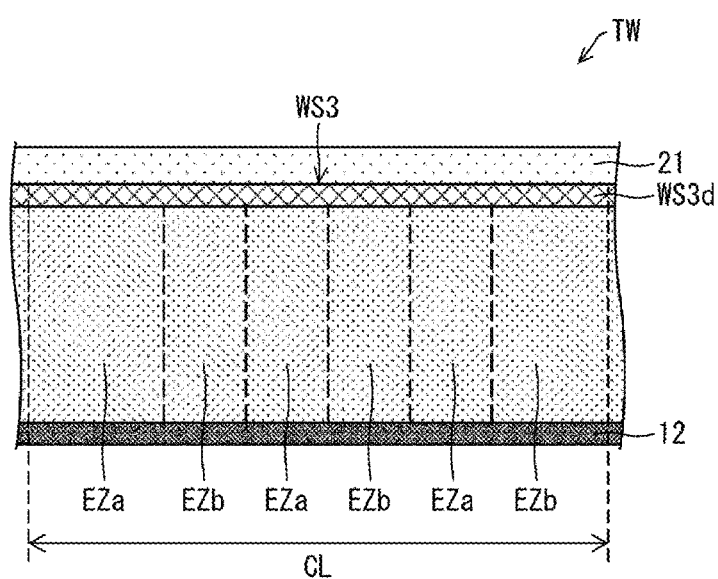
FIG. 6 is a cross-sectional view taken along the line B-B' in FIG. 4.
Figure 7:
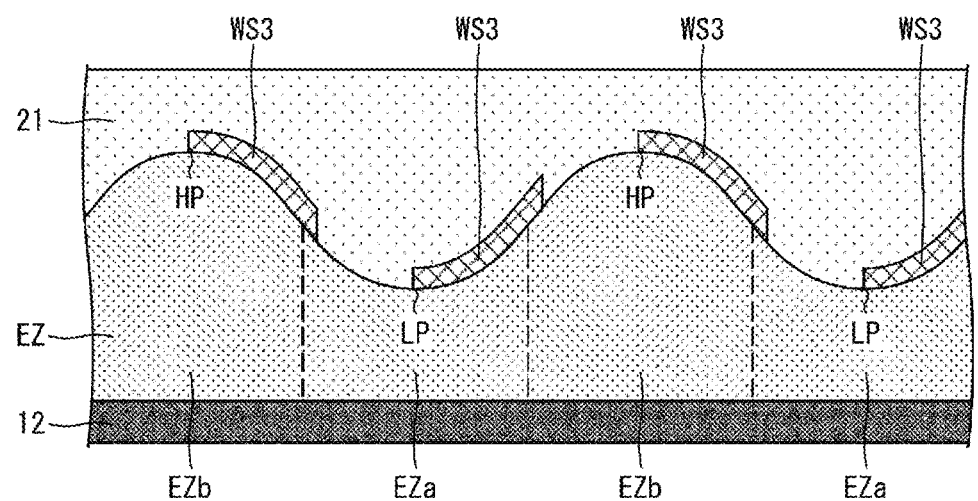
FIG. 7 is a cross-sectional view taken along the line C-C' in FIG. 4.

FIG. 5 is a cross-sectional view taken along the line A-A' in FIG. 4. FIG. 6 is a cross-sectional view taken along the line B-B' in FIG. 4. FIG. 7 is a cross-sectional view taken along the line C-C' in FIG. 4.

As illustrated in FIG. 5, the inorganic layered film including the barrier layer 3, the inorganic insulating film (first inorganic insulating film) 16, the inorganic insulating film (second inorganic insulating film) 18, and the inorganic insulating film (third inorganic insulating film) 20 is removed from the bending region CL of the flexible EL display device 2.

The bending region CL of the flexible EL display device 2 is formed in a slit-like shape. As illustrated in FIG. 3, the bending region CL is an opening extending from one end portion to the opposite end portion of the flexible EL display device 2, and is located in a space between the display region DA and the terminals TM. For example, the bending region CL may have a width (the dimension of the bending region CL measured in the vertical direction in FIG. 3) may range from 1 mm to 2 mm, approximately, but such widths are not the only possible ones. The width of the bending region CL is variable depending upon the size, the usage, and the like of the flexible EL display device 2.

In this embodiment, by taking account of the easiness to bend the flexible organic EL display device 2 and the possible occurrence of cracks in the inorganic layered film, the entire inorganic layered film (including the barrier layer 3, the inorganic insulating film (first inorganic insulating film) 16, the inorganic insulating film (second inorganic insulating film) 18, and the inorganic insulating film (third inorganic insulating film) 20 is removed from the bending region CL, but such a configuration is not the only possible one. Alternatively, at least a part of the above-mentioned layers of the inorganic layered film may be removed from the bending region CL. Alternatively, for example, the entirety or only a part of the inorganic insulating film 20, the uppermost layer of the inorganic layered film may be removed. The entire inorganic insulating film 20 and the entirety or only a part of the inorganic insulating film 18 may be removed. The entire inorganic insulating film 20, the entire inorganic insulating film 18, and the entirety or only a part of the inorganic insulating film 16 may be removed. The entire inorganic insulating film 20, the entire inorganic insulating film 18, the entire inorganic insulating film 16, and only a part of the barrier layer 3 may be removed.

As illustrated in FIG. 5, in this embodiment, the side surface of the slit of the bending region CL is formed in a planar shape by aligning, with one another in a plan view, a side surface Na of the slit of the barrier layer 3, a side surface Nb of the slit of the inorganic insulating film 16, a side surface Nc of the slit of the inorganic insulating film 18, and a side surface Nd of the slit of the inorganic insulating film 20. This, however, is not the only possible configuration. Alternatively, the side surface Na, the side surface Nb, the side surface Nc, and the side surface Nd do not have to be aligned with one another in a plan view. For example, each one of the side surface Na, the side surface Nb, the side surface Nc, and the side surface Nd may be formed in a forwardly tapered shape, and the side surface of the slit of the bending region CL may be formed in a forwardly tapered shape by arranging the side surface Na, the side surface Nb, the side surface Nc, and the side surface Nd gradually at inner positions in this order.

In addition, in this embodiment, a side surface Nx of the slit of the lower face film 10 is aligned with the side surface Na, the side surface Nb, the side surface Nc, and the side surface Nd in a plan view, but this is not the only possible configuration. Alternatively, the side surface Nx of the slit of the lower face film 10 may be not aligned with the side surface Na, the side surface Nb, the side surface Nc or the side surface Nd in a plan view.

Note that in a case where the lower face film 10 is sufficiently flexible, the lower face film 10 may have no slits.

As illustrated in FIG. 5, a reinforcement film EZ made, for example, from a coatable photosensitive organic material, such as polyimide and acryl, is formed as a higher layer than the inorganic insulating film 20 and a lower layer than the flattening film 21. The slit of the bending region CL is filled with the reinforcement film EZ.

As illustrated in FIG. 4 and FIG. 5, the terminal wiring lines TW include: first wiring lines WS1 located on one side of the bending region CL; second wiring lines WS2 located on the other side thereof; and lead wiring lines WS3 passing through the bending region CL and electrically connected to both the first wiring lines WS1 and the second wiring lines WS2.

Specifically, the first wiring lines WS1 and the second wiring lines WS2 are formed as the same layer in which the gate electrode GE (see FIG. 2) or the capacitance wiring lines CE included in the TFT layer 4 are formed. The lead wiring lines WS3 are formed as the same layer in which the source/drain wiring lines SH (see FIG. 2) and the terminals TM included in the TFT layer 4 are formed.

The lead wiring lines WS3 extend on the reinforcement film EZ from one side of the bending region CL to the opposite side of the bending region CL. In the bending region CL, the lead wiring lines WS3 are sandwiched between the reinforcement film EZ and the flattening film 21. The reinforcement film EZ and the flattening film 21 may be made from the same organic material (e.g., polyimide).

An end of each lead wiring line WS3 is connected to the first wiring line WS1 through both a contact hole Hct formed in the inorganic insulating film 18 and a contact hole Hd1 formed in the inorganic insulating film 20. A different end of each lead wiring line WS3 is connected to the second wiring line WS2 through both a contact hole Hc2 formed in the inorganic insulating film 18 and a contact hole Hd2 formed in the inorganic insulating film 20.

As illustrated in FIG. 4 and FIG. 5, in the bending region CL, the reinforcement film EZ has recessed portions EZa with recessed surfaces and protruding portions EZb with protruding surfaces. The recessed portions EZa and the protruding portions EZb are alternately arranged both in the longitudinal direction of each of the lead wiring lines WS3 (first direction) and in the width direction of each of the lead wiring lines WS3 (second direction), and thus are arranged in a staggered arrangement.

As illustrated in FIG. 5 and FIG. 7, the recessed portion EZa has a bottom portion LP, which is a portion having the smallest film thickness within the recessed portion EZa. The protruding portion EZb has a head portion HP, which is a portion having the largest film thickness within the protruding portion EZb.

In this embodiment, the bottom portion LP is formed in each of the recessed portions EZa whereas the head portion HP is formed in each of the protruding portions EZb. Hence, as illustrated in FIG. 5 and FIG. 7, each recessed portion EZa has a substantial inversed half-sphere shape (substantial inversed-dome shape), and each protruding portion EZb has a substantial half-sphere shape (substantial dome shape). These shapes are not the only possible ones. Alternatively, for example, each recessed portion EZa may have a substantially inversed pyramidal shape or a substantially inversed conical shape with the bottom portion LP and being the apex of the pyramid or of the cone, whereas each protruding portion EZb may have a substantially pyramidal shape or a substantially conical shape with the head portion HP being the apex of the pyramid or the cone. Still alternatively, each recessed portion EZa and each protruding portion EZb may be formed to have a planar-shaped bottom portion LP and a planar-shaped head portion HP, respectively.

As illustrated in FIG. 4 and FIG. 5, each of the lead wiring line WS3 extends in the first direction passing on the bottom portion LP of each recessed portion EZa and on the head portion HP of each protruding portion EZb.

As illustrated in FIG. 5, in the lead wiring line WS3, the portion over the bottom portion LP in each recessed portion EZa is a lead wiring line WS3a, the portion over the head portion HP in each protruding portion EZb is a lead wiring line WS3b, and the portion over the border between the recessed portion EZa and the protruding portion EZb in the first direction is a lead wiring line WS3c.

As described above, in the bending region CL, each of the lead wiring lines WS3 passes on the bottom portion LP in each recessed portion EZa and on the head portion HP in each protruding portion EZb. Hence, each wiring line WS3 has portions that are greatly curved in the thickness direction of the flexible EL display device 2. Accordingly, even when the flexible EL display device 2 is bent at the bending region CL, the breakage of lead wiring line WS3 can be suppressed.

In addition, as illustrated in FIG. 4 and FIG. 7, each of the lead wiring lines WS3 has a portion passing on the border between the recessed portion EZa and the protruding portion EZb in the second direction.

As illustrated in FIG. 6, the border between the recessed portion EZa and the protruding portion EZb in the second direction is formed in a substantially planar shape. Hence, the lead wiring line WS3 has a lead wiring line WS3d, which is a portion formed on the border between the recessed portion EZa and the protruding portion EZb in the second direction. Accordingly, even when the flexible EL display device 2 is bent at the bending region CL, the film peeling of the lead wiring line WS3 from the reinforcement film EZ can be suppressed.

As illustrated in FIG. 4, the description in this embodiment is based on a case where each of the lead wiring lines WS3 has a straight-line shape extending straight from one end to the other and having a certain dimension in the second direction. This, however, is not the only possible shape. Alternatively, each of the lead wiring lines WS3 may have any shape, including a curved-line shape, as long as the lead wiring line WS3 includes: the lead wiring line WS3a, which is the portion formed on the bottom portion LP in each recessed portion EZa; the lead wiring line WS3b, which is the portion formed on the head portion HP in each protruding portion EZb; and the lead wiring line WS3d, which is the portion formed on the border between the recessed portion EZa and the protruding portion EZb in the second direction.

Figure 8A:
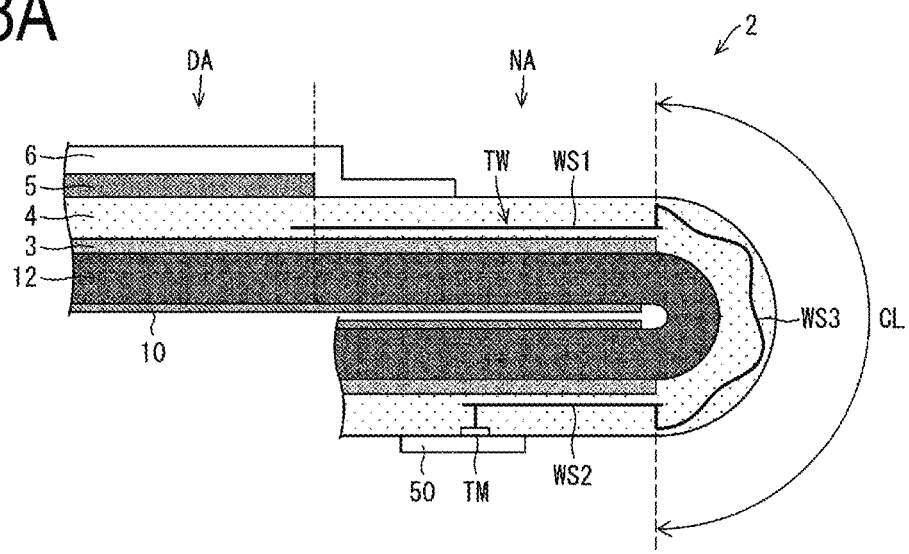
FIGS. 8A and 8B are diagrams illustrating the flexible EL display device of the first embodiment bent at the bending region.
Figure 8B:
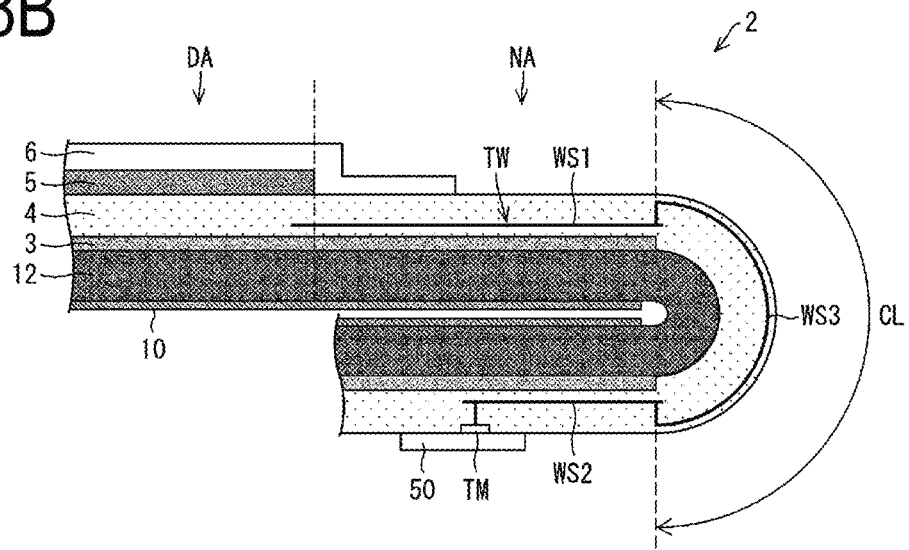

FIGS. 8A and 8B are diagrams illustrating the flexible EL display device 2 bent at the bending region CL.

As illustrated in FIG. 8A, in the bending region CL, each lead wiring line WS3 includes portions that are greatly curved in the thickness direction of the flexible EL display device 2. In addition, as illustrated in FIG. 8B, each lead wiring line WS3 also includes a portion formed on the substantially planar face of the border between the recessed portion EZa and the protruding portion EZb.

The flexible EL display device 2 thus provided is capable of suppressing the breakage of the lead wiring lines WS3 in the bending region CL and the film peeling of the lead wiring lines WS3 in the bending region CL.

Figure 9:
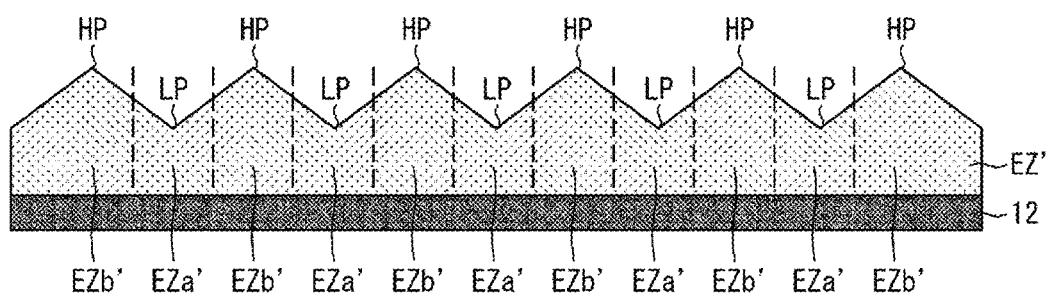
FIG. 9 is a diagram illustrating an exemplar reinforcement film applicable to the flexible EL display device of the first embodiment and including recessed portions and protruding portions that may have various shapes.

FIG. 9 is a diagram illustrating an example of the reinforcement film EZ' including a recessed portion EZa' having an inverse quadrangular pyramidal shape and a protruding portion EZb' having a quadrangular pyramidal shape.

Even in a case of using such a reinforcement film EZ', each of the lead wiring lines WS3 includes: portions passing on the bottom portion LP in each recessed portion EZa' and passing on the head portion HP in each protruding portion EZb'; and portions formed on the borders between each of the recessed portions EZa' and the corresponding one of the protruding portions EZb' and indicated by the dashed lines in FIG. 9. Thus provided is the flexible EL display device 2 that is capable of suppressing both the breakage of and the film peeling of the lead wiring lines WS3 provided in the bending region CL.

Second Embodiment

Next, a second embodiment of the disclosure will be described with reference to FIG. 10. This embodiment differs from the first embodiment in that in the reinforcement film, each of recessed portions EZa" and each of protruding portions EZb" have larger dimensions in the second direction than their respective dimensions in the first direction, and that the bottom portion in each recessed portion EZa" and the head portion in each protruding portion EZb" are planar-shaped surfaces. The second embodiment is similar to the above-described first embodiment in the other points. For convenience of descriptions, members having the same functions as those of the members illustrated in the diagrams of the first embodiment are denoted by the same reference numerals, and descriptions thereof will be omitted.

Figure 10:
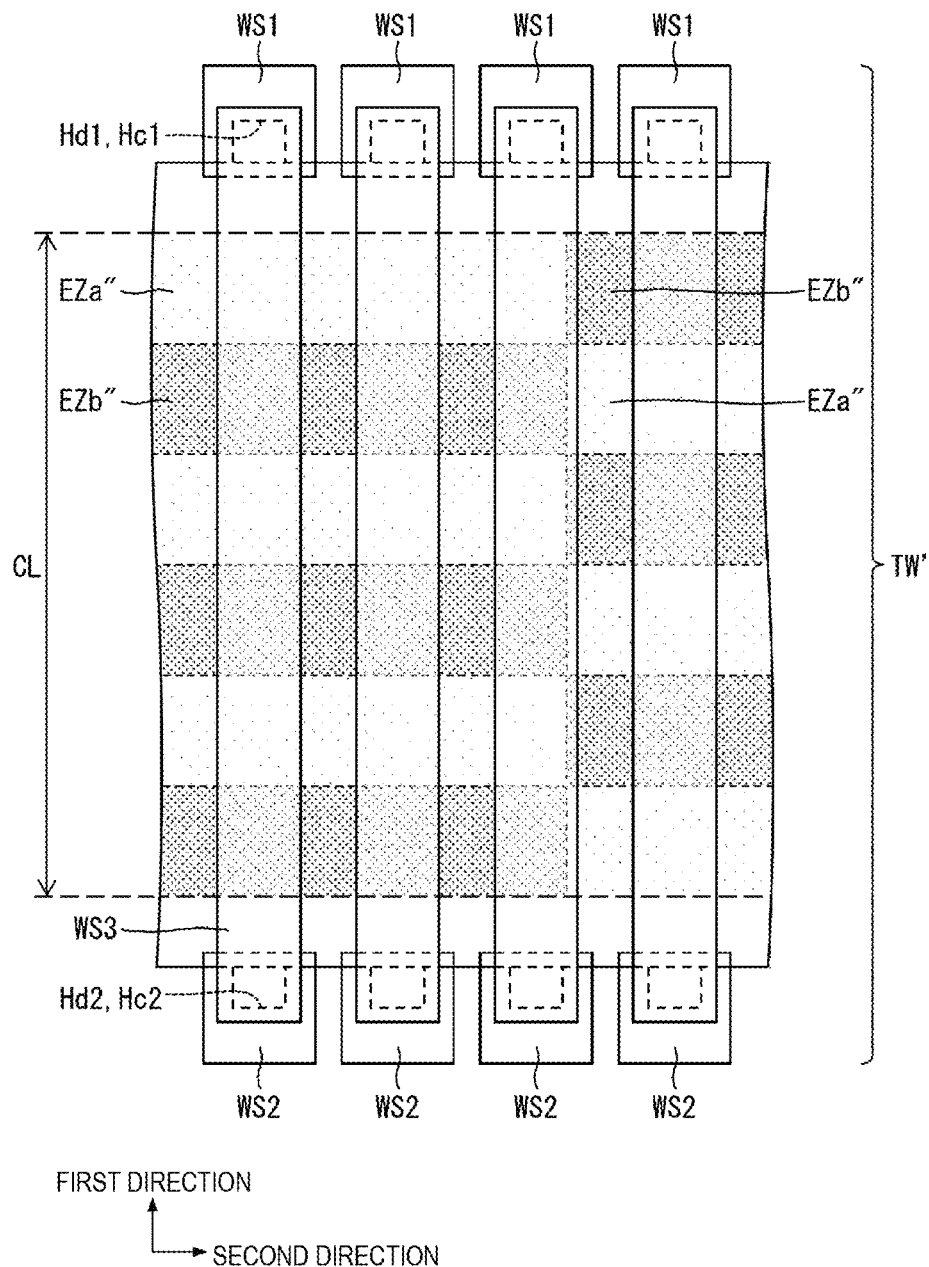
FIG. 10 is a plan view illustrating lead wiring lines provided in a bending region of a flexible EL display device of a second embodiment.

FIG. 10 is a plan view illustrating lead wiring lines WS3 provided in a bending region CL of a flexible EL display device of the second embodiment.

As illustrated in FIG. 10, the terminal wiring lines TW' include: first wiring lines WS1 located on one side of the bending region CL; second wiring lines WS2 located on the other side thereof; and lead wiring lines WS3 passing through the bending region CL and electrically connected to both the first wiring lines WS1 and the second wiring lines WS2.

Each of the recessed portions EZa" and each of the protruding portions EZb" in the reinforcement film of this embodiment have larger dimensions in the second direction than their respective dimensions in the first direction. In addition, the bottom portion in each recessed portion EZa" and the head portion in each protruding portion EZb" are planar-shaped surfaces.

The planar-shaped bottom portion in each recessed portion EZa" reaches both a portion near the border with the protruding portion EZb" that is adjacent in the first direction, and a portion near the border with the protruding portion EZb" that is adjacent in the second direction.

On the other hand, the planar-shaped head portion in each protruding portion EZb" reaches both a portion near the border with the recessed portion EZa" that is adjacent in the first direction, and a portion near the border with the recessed portion EZa" that is adjacent in the second direction.

Of those four lead wiring lines WS3 illustrated in FIG. 10, each of the first, the second, and the fourth lead wiring line WS3 from the left-hand side of FIG. 10 includes only the portions passing through the bottom portion in each recessed portion EZa" and the head portion of each protruding portion EZb." The third lead wiring line WS3 from the left-hand side, however, includes not only the portion passing through the bottom portion of each recessed portion EZa" and the head portion of each protruding portion EZb" but also the portion formed on the border between the recessed portion EZa" and the protruding portion EZb" in the second direction. Thus provided is the flexible EL display device that is capable of suppressing both the breakage of and the film peeling of the lead wiring lines WS3 provided in the bending region CL.

Third Embodiment

Next, a third embodiment of the disclosure will be described with reference to FIGS. 11A to 11C and FIGS. 12A to 12C. This embodiment differs from the first and second embodiments in that the shape of each of lead wiring lines WS4 includes a curved-line shape. The third embodiment is similar to the above-described first and second embodiments in the other points. For convenience of descriptions, members having the same functions as those of the members illustrated in the diagrams in the first and second embodiments are denoted by the same reference numerals, and descriptions thereof will be omitted.

Figure 11A:
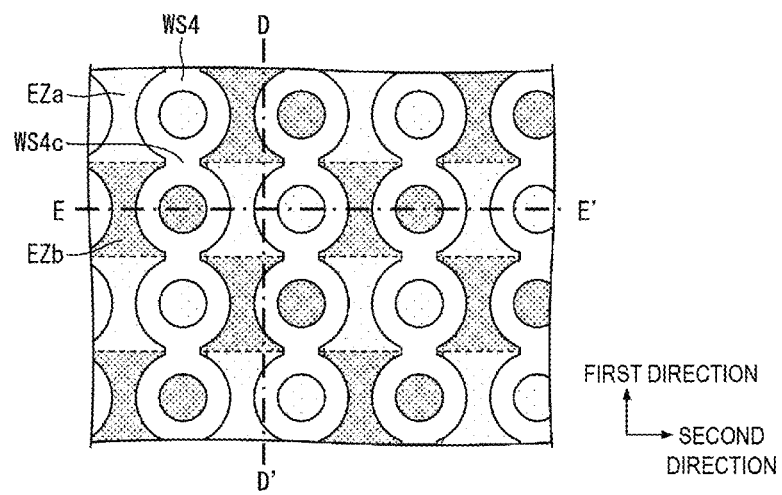
FIGS. 11A to 11C are diagrams describing lead wiring lines provided in a bending region of a flexible EL display device of a third embodiment.
Figure 11B:
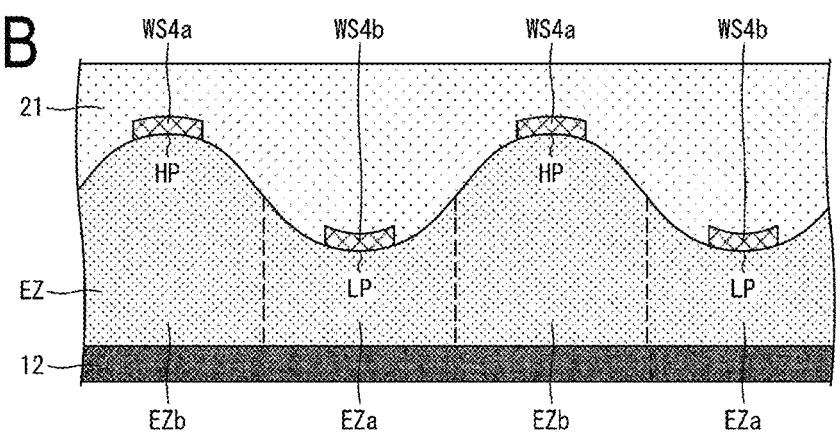
Figure 11C:
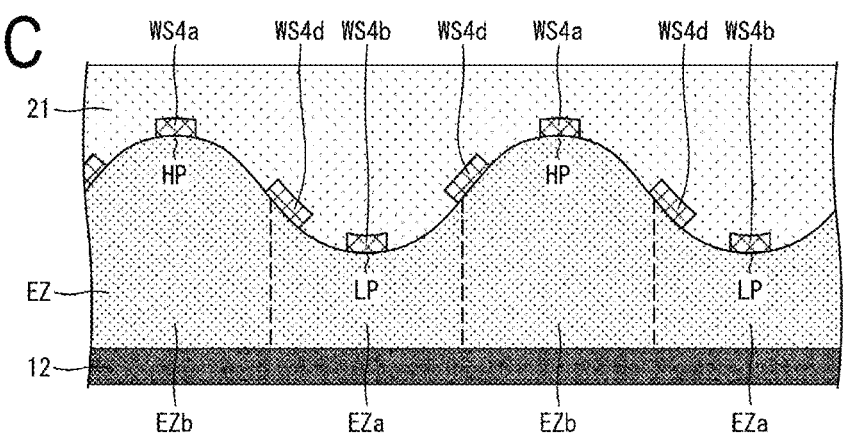

FIG. 11A is a diagram describing the lead wiring lines WS4 provided in a bending region of a flexible EL display device of the third embodiment. FIG. 11B is a cross-sectional view taken along the line D-D' in FIG. 11A. FIG. 11C is a cross-sectional view taken along the line E-E' in FIG. 11A.

As illustrated in FIGS. 11A to 11C, in the lead wiring line WS4, the portion over the bottom portion LP in each recessed portion EZa is a lead wiring line WS4a, the portion over the head portion HP in each protruding portion EZb is a lead wiring line WS4b, and the portion over the border between the recessed portion EZa and the protruding portion EZb in the first direction is a lead wiring line WS4c.

In addition, as illustrated in FIGS. 11A and 11C, the border between the recessed portion EZa and the protruding portion EZb in the second direction is formed in a substantially planar shape. Hence, the lead wiring line WS4 has a lead wiring line WS4d, which is a portion formed on the border between the recessed portion EZa and the protruding portion EZb in the second direction.

As described above, in the bending region CL, each of the lead wiring lines WS4 passes on the bottom portion LP in each recessed portion EZa and on the head portion HP in each protruding portion EZb. Hence, each wiring line WS4 has portions that are greatly curved in the thickness direction of the flexible EL display device. Accordingly, even when the flexible EL display device is bent at the bending region CL, the breakage of lead wiring line WS4 can be suppressed.

In addition, each of the lead wiring lines WS4 has a lead wiring line WS4d, which is a portion formed on the border between the recessed portion EZa and the protruding portion EZb in the second direction. Accordingly, even when the flexible EL display device is bent at the bending region CL, the film peeling of the lead wiring line WS4 from the reinforcement film EZ can be suppressed.

The description of this embodiment is based on a case where each of the lead wiring lines WS4 is a wiring line including curved-line-shaped portions each of which has a circular opening located at the center thereof. Such a shape is not the only possible shape of each lead wiring line WS4.

Figure 12A:
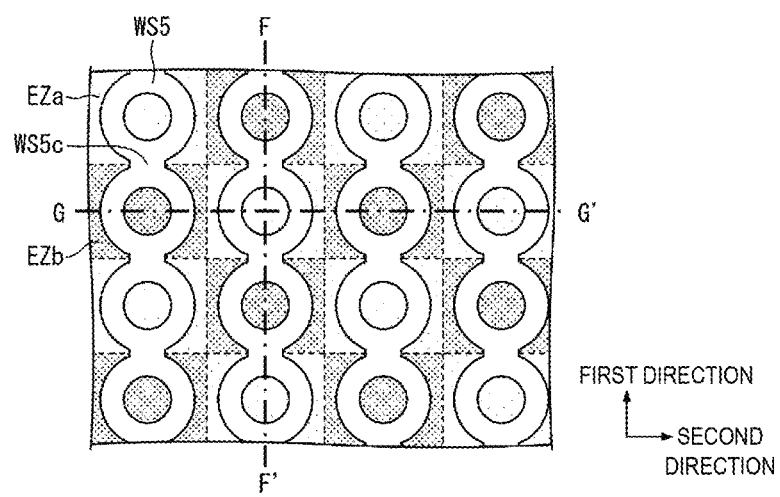
FIGS. 12A to 12C are diagrams describing problems of lead wiring lines provided in a bending region of a flexible EL display device of a Comparative Example.
Figure 12B:
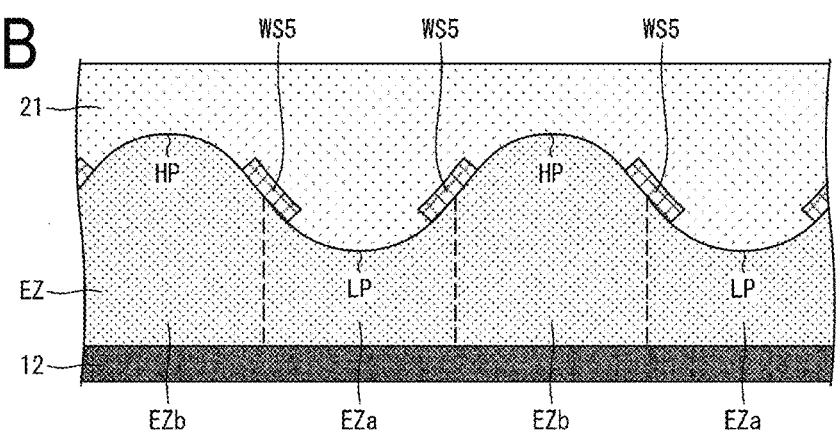
Figure 12C:
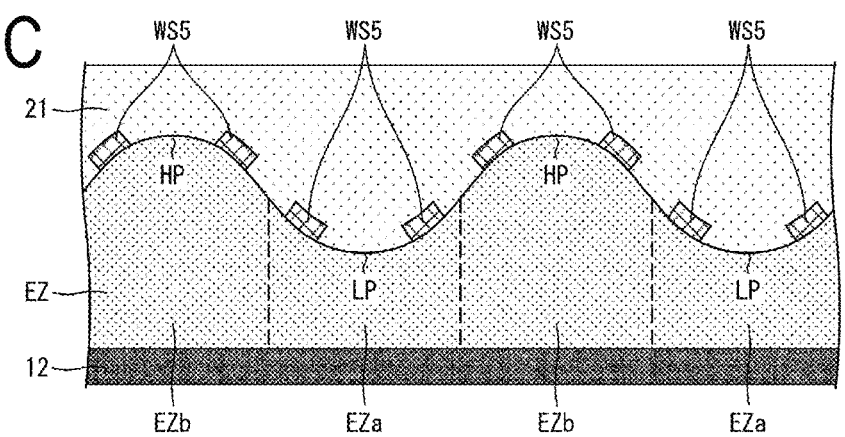

FIG. 12A is a diagram describing the lead wiring lines WS5 provided in a bending region of a flexible EL display device of a Comparative Example. FIG. 12B is a cross-sectional view taken along the line F-F' in FIG. 12A. FIG. 12C is a cross-sectional view taken along the line G-G' in FIG. 12A.

Each of the lead wiring lines WS5 illustrated in FIGS. 12A to 12C has a shape that is identical with the shape of each of the lead wiring lines WS4 illustrated in FIGS. 11A to 11C. Each of the lead wiring lines WS5 is arranged in a different position relative to the recessed portions EZa and the protruding portions EZb of the reinforcement film EZ from the corresponding position of each of the lead wiring lines WS4.

Each of the lead wiring lines WS5 illustrated in FIGS. 12A to 12C has an opening overlaps both the bottom portion LP in each recessed portion EZa or the head portion HP in each protruding portion EZb in a plan view. Hence, each of the lead wiring lines WS5 passes on none of the bottom portion LP in each recessed portion EZa and the head portion HP in each protruding portion EZb. Accordingly, in the thickness direction of the flexible EL display device, each of the lead wiring lines WS5 has no greatly curved portions. In addition, each of the lead wiring lines WS5 is not formed on the border between the recessed portion EZa and the protruding portion EZb in the second direction.

Accordingly, each of the lead wiring lines WS5 illustrated in FIGS. 12A to 12C is capable of suppressing neither the wiring breakage nor the film peeling.

Fourth Embodiment

Next, a fourth embodiment of the disclosure will be described with reference to FIG. 13. This embodiment differs from the first to third embodiments in that the lead wiring line WS5 illustrated in FIGS. 12A to 12C is shifted in the first direction. This embodiment is similar to the above-described first to third embodiments in the other points. For convenience of descriptions, members having the same functions as those of the members illustrated in the diagrams of the first to third embodiments are denoted by the same reference numerals, and descriptions thereof will be omitted.

Figure 13:
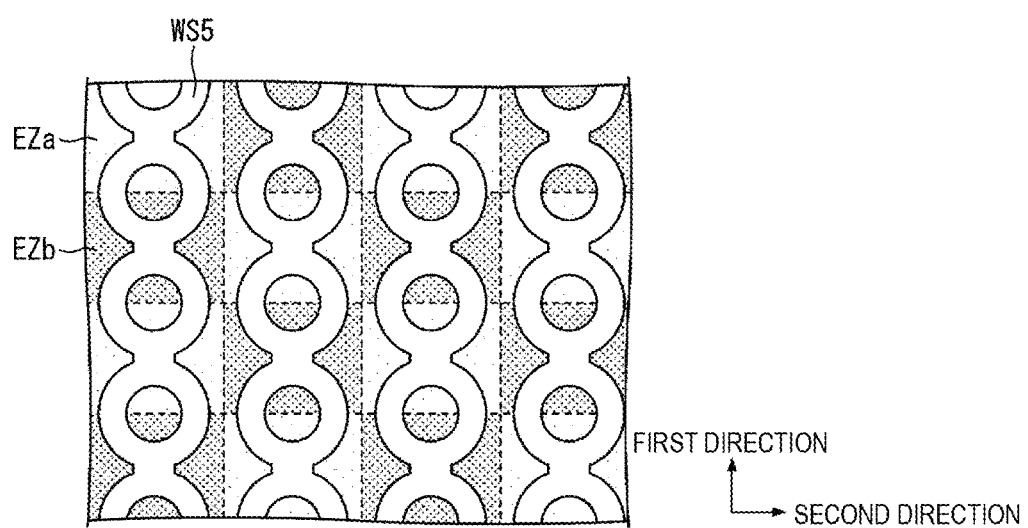
FIG. 13 is a diagram describing lead wiring lines provided in a bending region of a flexible EL display device of a fourth embodiment.

FIG. 13 is a diagram describing lead wiring lines WS5 provided in a bending region of a flexible EL display device of the fourth embodiment and shifted in the first direction.

As illustrated in FIG. 13, each of the lead wiring lines WS5 includes curved-shaped portions each of which has a circular opening at the center. Each of the openings overlaps none of the bottom portion LP in each recessed portion EZa and the head portion HP in each protruding portion EZb in a plan view.

Each of the lead wiring lines WS5 passes on the bottom portions LP and the head portions HP arranged in the first direction, that is, the direction in which each of the lead wiring lines WS5 extends.

To put it differently, each of the lead wiring lines WS5 includes a plurality of openings arranged in the first direction. A first wiring-line section of each lead wiring line WS5 located between a particular opening of the plurality of openings and the adjacent opening on a first side of the particular one (i.e., a straight-line-shaped portion of each lead wiring line WS5 illustrated in FIG. 13) overlaps the corresponding bottom portion LP in a plan view. A second wiring-line section of each lead wiring line WS5 located between the particular opening and the adjacent opening on the opposite side of the particular opening (i.e., a different straight-line-shaped portion of each lead wiring line WS5 illustrated in FIG. 13) overlaps the corresponding head portion HP in a plan view.

The flexible display device thus provided is capable of suppressing the breakage of the lead wiring lines WS5 provided in the bending region.

The description of this embodiment is based on a case where each of the lead wiring lines WS5 is a wiring line including curved-line-shaped portions each of which has a circular opening located at the center thereof. Such a shape is not the only possible shape of each lead wiring line WS5. Alternatively, each lead wiring line WS5 may be a straight-line-shaped wiring line having rectangular-shaped openings, for example.

Fifth Embodiment

Next, a fifth embodiment of the disclosure will be described with reference to FIGS. 14A and 14B. This embodiment differs from the first to fourth embodiments in that the reinforcement film EZ' is subjected to a dry etching process using the lead wiring lines WS3 as masks and that a reinforcement film EZ''' thus formed is capable of preventing the film peeling of the lead wiring lines WS3 that would otherwise occur when the flexible EL display device is bent at the bending region thereof. This embodiment is similar to the above-described first to fourth embodiments in the other points. For convenience of descriptions, members having the same functions as those of the members illustrated in the diagrams in the first to fourth embodiments are denoted by the same reference numerals, and descriptions thereof will be omitted.

Figure 14A:
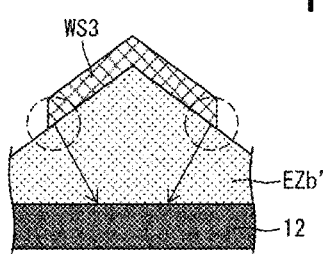
FIGS. 14A and 14B are diagrams illustrating an exemplar reinforcement film provided in a bending region of a flexible EL display device of a fifth embodiment.

FIG. 14A is a diagram illustrating one of the lead wiring lines WS3 formed in a region including the head portion HP of the corresponding protruding portion EZb' of the reinforcement film EZ' illustrated in FIG. 9. FIG. 14B is a diagram illustrating a case where the protruding portions EZb' of the reinforcement film EZ' are subjected to a dry etching process using, as masks, the lead wiring lines WS3 illustrated in FIG. 14A, and where protruding portions EZb''' of reinforcement film EZ''' thus formed are capable of preventing the film peeling of the lead wiring lines WS3 that would otherwise occur when the flexible EL display device is bent at the bending region thereof.

In a case where forces in the directions indicated by the arrows in FIG. 14A act on each lead wiring line WS3, the lead wiring line WS3 tends to be easily peeled off from the corresponding protruding portion EZb' of the reinforcement film EZ'. As illustrated in FIG. 14B, the protruding portion EZb''' of the reinforcement film EZ''', however, has a step-like structure that is formed by a portion overlapping the lead wiring line WS3 in a plan view and a portion not overlapping the lead wiring line WS3 in a plan view. Hence, the reinforcement film EZ''' is capable of suppressing the forces illustrated in FIG. 14A from being generated in the portion overlapping the lead wiring line WS3 in a plan view.

Though not illustrated, the recessed portions EZa' of the reinforcement film EZ' are also subjected to a dry etching process using the lead wiring lines WS3 as masks, and thus each of the recessed portions EZa''' of the reinforcement film EZ''' has a step-like structure that is formed by a portion overlapping the lead wiring line WS3 in a plan view and a portion not overlapping the lead wiring line WS3 in a plan view. Hence, the reinforcement film EZ''' is capable of suppressing the forces illustrated in FIG. 14A from being generated in the portion overlapping the lead wiring line WS3 in a plan view.

The description of this embodiment is based on a case where the reinforcement film used is the reinforcement film EZ' illustrated in FIG. 9, but this is not the only possible configuration. Alternatively, any of the reinforcement films described in the first to fourth embodiments may be used with a similar effect.

Figure 14B:
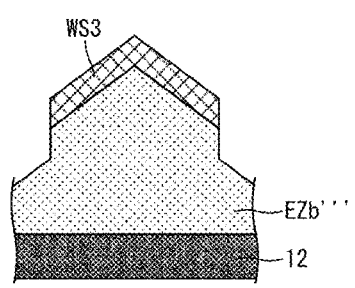

In this embodiment, the step-like structure illustrated in FIG. 14B allows each of the lead wiring lines WS3 to pass only on the bottom portion LP in the recessed portion EZa''' of the reinforcement film EZ''' and the head portion HP in the protruding portion EZb''' thereof as illustrated in FIGS. 14A and 14B. Hence, unlike the lead wiring lines WS3 of the above-described first to third embodiments, each of the lead wiring lines WS3 of this embodiment does not have to pass on at least a part of the border between the recessed portion EZa''' and the protruding portion EZb''' in the second direction.

Note that for the purpose of suppressing further the film peeling of the lead wiring lines, it is preferable to add the step-like structure illustrated in FIG. 14B to the configuration of the above-described first to third embodiments, where each of the lead wiring lines passes on at least a part of the border between the recessed portion and the protruding portion in the second direction.

Note that a manufacturing process of the flexible EL display device includes: a step of forming the bending region CL by removing entirely a slit-shaped portion of the inorganic layered film including the barrier layer 3, the inorganic insulating film (first inorganic insulating film) 16, the inorganic insulating film (second inorganic insulating film) 18, and the inorganic insulating film (third inorganic insulating film) 20; a step of forming the reinforcement film EZ (first resin layer) with which the bending region CL is filled and that includes the plurality of recessed portions each of which includes the bottom portion LP having the smallest film thickness and the plurality of protruding portions each of which includes the head portion HP having the smallest film thickness; a step of forming the lead wiring lines WS3 on the reinforcement film EZ so that each of the lead wiring lines WS3 overlaps, in a plan view, both the bottom portions and the head portions arranged in the first direction, that is, the direction in which each of the lead wiring lines WS3 extends; and a step of forming a step-like structure, by the portion overlapping the lead wiring line WS3 in a plan view and the portion not overlapping the lead wiring line WS3 in a plan view, in each of the recessed portions in the reinforcement film EZ and each of the protruding portions in the reinforcement film EZ.

In the step of forming the lead wiring lines WS3 on the reinforcement film EZ, it is preferable to form the lead wiring lines WS3 so that each lead wiring line WS3 overlaps, in a plan view, the bottom portions and the head portions arranged in the first direction, that is, the direction in which the lead wiring line WS3 extends and that each lead wiring line WS3 overlaps, in a plan view, at least a part of the border between each of the recessed portions and the corresponding one of the protruding portions arranged in the second direction, that is, the width direction of the lead wiring line WS3.

Supplement

Aspect 1

A flexible display device comprising:
a display region;
a frame region surrounding the display region;
a terminal portion provided in an end portion of the frame region;
a bending region provided between the display region and the terminal portion; and
a lead wiring line configured to electrically connect a first wiring line located on one side of the bending region and a second wiring line located on a different side of the bending region,
wherein the bending region is a slit-shaped region formed by removing at least a part of an inorganic film including one or more layers,
the bending region is filled with a first resin layer including a plurality of recessed portions and a plurality of protruding portions, each of the recessed portions including a bottom portion having a smallest film thickness, and each of the protruding portions including a head portion having a largest film thickness, and
the lead wiring line is formed on the first resin layer, and includes portions overlapping, in a plan view, the bottom portions and the head portions arranged in a first direction in which the lead wiring line extends.

Aspect 2

The flexible display device according to Aspect 1
wherein in each of the recessed portion in the first resin layer and in each of the protruding portion in the first resin layer, a step-like structure is formed by the portion overlapping the lead wiring line in a plan view and the portion not overlapping the lead wiring line in a plan view.

Aspect 3

The flexible display device according to Aspect 1 or 2
wherein the lead wiring line formed on the first resin layer includes a portion overlapping, in a plan view, at least a part of borders between the recessed portions and the protruding portions arranged in a second direction that is a width direction of the lead wiring line.

Aspect 4

The flexible display device according to any one of Aspects 1 to 3,
wherein the lead wiring line includes a plurality of openings, and
each of the plurality of openings of the lead wiring line does not overlap any of the bottom portions and the head portions in a plan view.

Aspect 5

The flexible display device according to Aspect 1 or 2,
wherein the lead wiring line includes a plurality of openings, and
the lead wiring line includes a first wiring-line section located between one particular opening of the plurality of openings and a different one opening of the plurality of openings, the different one being adjacent the one particular opening on a first side thereof, and the first wiring-line section overlaps the corresponding bottom portion in a plan view, and the lead wiring line includes a second wiring-line section located between the one particular opening and a still different one opening of the plurality of openings, the still different one being adjacent the one particular opening on a second side thereof, and the second wiring-line section overlaps the corresponding head portion in a plan view.

Aspect 6

The flexible display device according to any one of Aspects 1 to 5, wherein each of the recessed portions has an inversed half-sphere shape, and each of the protruding portions has a half-sphere shape.

Aspect 7

The flexible display device according to any one of Aspects 1 to 5, wherein each of the recessed portions has an inversed pyramidal shape, and each of the protruding portion has a pyramidal shape.

Aspect 8

The flexible display device according to any one of Aspects 1 to 5, wherein each of the recessed portions has an inversed conical shape, and each of the protruding portion has a conical shape.

Aspect 9

The flexible display device according to any one of Aspects 1 to 8, wherein the recessed portions and the protruding portions are alternately arranged both in a first direction in which each of the lead wiring line extends and in a second direction that is a width direction of the lead wiring line.

Aspect 10

The flexible display device according to any one of Aspects 1 to 5, wherein each of the recessed portions and the protruding portions has a larger dimension measured in a second direction that is a width direction of the lead wiring line than a dimension measured in a first direction in which the lead wiring line extends, and each of the bottom portions and the head portions has a planar shape.

Aspect 11

The flexible display device according to any one of Aspects 1 to 10, wherein the lead wiring line has two ends each of which has a straight-lined shape extending in the first direction.

Aspect 12

The flexible display device according to any one of Aspects 1 to 10, wherein at least a part of the lead wiring line has two ends each of which has a curved-lined shape.

Aspect 13

The flexible display device according to any one of Aspects 1 to 12, further comprising:

a second resin layer configured to cover the first resin layer and the lead wiring line.

Aspect 14

A method of manufacturing a flexible display device including: a display region; a frame region surrounding the display region; a terminal portion provided in an end portion of the frame region; a bending region provided between the display region and the terminal portion; and a lead wiring line configured to electrically connect a first wiring line located on one side of the bending region and a second wiring line located on a different side of the bending region, the method including:

a bending region forming step for forming the bending region having a slit-shape by removing at least a part of an inorganic film including one or more layers;

a first resin layer forming step for forming a first resin layer with which the bending region is filled by forming a plurality of recessed portions each of which includes a bottom portion having a smallest film thickness and a plurality of protruding portions each of which includes a head portion having a largest film thickness; and a lead wiring line forming step for forming the lead wiring line on the first resin layer by forming the lead wiring line configured to overlap, in a plan view, both the bottom portions and the head portions arranged in a first direction in which the lead wiring line extends.

Aspect 15

The method of manufacturing a flexible display device according to Aspect 14, further comprising:

a step-like structure forming step for forming a step-like structure in each of the recessed portions in the first resin layer and in each of the protruding portions in the first resin layer, the step-like structure being formed by a portion overlapping the lead wiring line in a plan view and a portion not overlapping the lead wiring line in a plan view.

Aspect 16

The method of manufacturing a flexible display device according to Aspect 15, wherein in the step-like structure forming step, dry etching is performed by use of the lead wiring line as a mask and thus the step-like structure is formed.

Aspect 17

The method of manufacturing a flexible display device according to any one of Aspects 14 to 16, wherein in the lead wiring line forming step for forming the lead wiring line on the first resin layer, the lead wiring line overlaps, in a plan view, the bottom portions and the head portions arranged in a first direction in which the lead wiring line extends, and the lead wiring line overlaps, in a plan view, at least a part of borders between the recessed portions and the protruding portions arranged in a second direction that is a width direction of the lead wiring line.

Aspect 18

The method of manufacturing a flexible display device according to any one of Aspects 14 to 17, wherein in the lead wiring line forming step for forming the lead wiring line on the first resin layer, a plurality of openings configured to overlap, in a plan view, none of the bottom portions and the head portions are formed in the lead wiring line.

Aspect 19

The method of manufacturing a flexible display device according to any one of Aspects 14 to 16, wherein in the lead wiring line forming step for forming the lead wiring line on the first resin layer, a plurality of openings are formed in the lead wiring line, the lead wiring line includes a first wiring-line section located between one particular opening of the plurality of openings and a different one opening of the plurality of openings, the different one being adjacent the one particular opening on a first side thereof, and the first wiring-line section overlaps the corresponding bottom portion in a plan view, and the lead wiring line includes a second wiring-line section located between the one particular opening and a still different one opening of the plurality of openings, the still different one being adjacent the one particular opening on a second side thereof, and the second wiring-line section overlaps the corresponding head portion in a plan view.

Additional Items

The disclosure is not limited to each of the embodiments stated above, and various modifications may be implemented within a range not departing from the scope of the claims. Embodiments obtained by appropriately combining technical approaches stated in each of the different embodiments also fall within the scope of the technology of the disclosure. Moreover, novel technical features may be formed by combining the technical approaches stated in each of the embodiments.

INDUSTRIAL APPLICABILITY

The disclosure is applicable to both a flexible display device and a method of manufacturing such a flexible display device.

REFERENCE SIGNS LIST

2 Flexible EL display device
3 Barrier layer
4 TFT layer
5 Organic EL element layer
6 Sealing layer
16, 18, and 20 Inorganic insulating film
21 Flattening film (second resin layer)
EZ Reinforcement film (first resin layer)
CL Bending region
DA Display region
NA Frame region
TM terminal (terminal portion)
TW Terminal wiring line
WS1 First wiring line
WS2 Second wiring line
WS3 and WS4 Lead wiring line
EZa, EZa', and EZa" Recessed portion
EZb, EZb', EZb", and EZb''' Protruding portion
HP Head portion
LP Bottom portion

The invention claimed is:
1. A flexible display device comprising:
a display region;
a frame region surrounding the display region;
a terminal portion provided in an end portion of the frame region;
a bending region provided between the display region and the terminal portion; and
a lead wiring line configured to electrically connect a first wiring line located on one side of the bending region and a second wiring line located on a different side of the bending region,
wherein the bending region is a slit-shaped region formed by removing at least a part of an inorganic film including one or more layers,
the bending region is filled with a first resin layer including a plurality of recessed portions and a plurality of protruding portions, each of the recessed portions including a bottom portion having a smallest film thickness, and each of the protruding portions including a head portion having a largest film thickness,
the lead wiring line is formed on the first resin layer, and includes portions overlapping, in a plan view, the bottom portion and the head portion arranged in a first direction in which the lead wiring line extends, and
in each of the recessed portions in the first resin layer and in each of the protruding portions in the first resin layer, a step-like structure is formed by a portion overlapping the lead wiring line in a plan view and a portion not overlapping the lead wiring line in a plan view.

2. The flexible display device according to claim 1, wherein the lead wiring line formed on the first resin layer includes a portion overlapping, in a plan view, at least a part of borders between each of the recessed portions and each of the protruding portions arranged in a second direction that is a width direction of the lead wiring line.

3. The flexible display device according to claim 1, wherein the lead wiring line includes a plurality of openings, and
each of the plurality of openings of the lead wiring line does not overlap any of the bottom portion and the head portion in a plan view.

4. The flexible display device according to claim 1, wherein the lead wiring line includes a plurality of openings,
the lead wiring line includes a first wiring-line section located between one particular opening of the plurality of openings and a different one opening of the plurality of openings, the different one being adjacent the one particular opening on a first side thereof, and the first wiring-line section overlaps the bottom portion in a plan view, and
the lead wiring line includes a second wiring-line section located between the one particular opening and a still different one opening of the plurality of openings, the still different one being adjacent the one particular opening on a second side thereof, and the second wiring-line section overlaps the head portion in a plan view.

5. The flexible display device according to claim 1, wherein each of the recessed portions has an inversed half-sphere shape, and
each of the protruding portions has a half-sphere shape.

6. The flexible display device according to claim 1, wherein each of the recessed portions has an inversed pyramidal shape, and
each of the protruding portions has a pyramidal shape.

7. The flexible display device according to claim 1, wherein each of the recessed portions has an inversed conical shape, and
each of the protruding portions has a conical shape.

8. The flexible display device according to claim 1, wherein each of the recessed portions and each of the protruding portions are alternately arranged both in the first direction in which the lead wiring line extends and in a second direction that is a width direction of the lead wiring line.

9. The flexible display device according to claim 1, wherein each of the recessed portions and each of the protruding portions has a larger dimension measured in a second direction that is a width direction of the lead wiring line than a dimension measured in the first direction in which the lead wiring line extends, and
the bottom portion and the head portion has a planar shape.

10. The flexible display device according to claim 1, wherein the lead wiring line has two ends each of which has a straight-lined shape extending in the first direction.

11. The flexible display device according to claim 1, wherein at least a part of the lead wiring line has two ends each of which has a curved-lined shape.

12. The flexible display device according to claim 1, further comprising:
a second resin layer configured to cover the first resin layer and the lead wiring line.

13. The flexible display device according to claim 1, wherein
the lead wiring line includes a plurality of openings, and
each of the plurality of openings of the lead wiring line does not overlap any of the bottom portion and the head portion in a plan view.

14. The flexible display device according to claim 13 wherein the lead wiring line formed on the first resin layer includes a portion overlapping, in a plan view, at least a part of borders between each of the recessed portions and each of the protruding portions arranged in a second direction that is a width direction of the lead wiring line.

15. The flexible display device according to claim 13 wherein the lead wiring line includes the plurality of openings,
the lead wiring line includes a first wiring-line section located between one particular opening of the plurality of openings and a different one opening of the plurality of openings, the different one being adjacent the one particular opening on a first side thereof, and the first wiring-line section overlaps the bottom portion in a plan view, and
the lead wiring line includes a second wiring-line section located between the one particular opening and a still different one opening of the plurality of openings, the still different one being adjacent the one particular opening on a second side thereof, and the second wiring-line section overlaps the head portion in a plan view.

16. The flexible display device according to claim 13, wherein each of the recessed portions and each of the protruding portions are alternately arranged both in the first direction in which the lead wiring line extends and in a second direction that is a width direction of the lead wiring line.

17. The flexible display device according to claim 13, wherein each of the recessed portions and each of the protruding portions has a larger dimension measured in a second direction that is a width direction of the lead wiring line than a dimension measured in the first direction in which the lead wiring line extends, and
the bottom portion and the head portion has a planar shape.

18. The flexible display device according to claim 13, wherein the lead wiring line has two ends each of which has a straight-lined shape extending in the first direction.

19. The flexible display device according to claim 13, wherein at least a part of the lead wiring line has two ends each of which has a curved-lined shape.

20. The flexible display device according to claim 13, further comprising:
a second resin layer configured to cover the first resin layer and the lead wiring line.

* * * * *